United States Patent
Rottstegge et al.

(10) Patent No.: US 6,974,655 B2
(45) Date of Patent: Dec. 13, 2005

(54) SILICON RESIST FOR PHOTOLITHOGRAPHY AT SHORT EXPOSURE WAVELENGTHS AND PROCESS FOR MAKING PHOTORESISTS

(75) Inventors: Jörg Rottstegge, Lilienthal (DE);
Christoph Hohle, Bubenreuth (DE);
Christian Eschbaumer, Schwaig (DE);
Michael Sebald, Weisendorf (DE);
Wolf-Dieter Domke, Adelsdorf (DE)

(73) Assignee: Infineon Technologies AG, Munich (DE)

( * ) Notice: Subject to any disclaimer, the term of this patent is extended or adjusted under 35 U.S.C. 154(b) by 298 days.

(21) Appl. No.: 10/233,915

(22) Filed: Sep. 3, 2002

(65) Prior Publication Data

US 2003/0148219 A1 Aug. 7, 2003

(30) Foreign Application Priority Data

Aug. 31, 2001 (DE) .......................... 101 42 600

(51) Int. Cl.[7] .......................... G03C 1/73; G03F 7/039; G03F 7/075; G03F 7/30; G03F 7/40
(52) U.S. Cl. .................. 430/270.1; 430/326; 430/327; 430/328; 430/330; 430/331; 430/905; 430/907; 430/910; 430/914
(58) Field of Search .............................. 430/270.1, 326, 430/327, 330, 313, 316–318, 328, 331, 905, 907, 910, 914

(56) References Cited

U.S. PATENT DOCUMENTS

| | | | |
|---|---|---|---|
| 5,234,793 A | * 8/1993 | Sebald et al. ............... | 430/323 |
| 5,234,794 A | 8/1993 | Sebald et al. ............... | 430/325 |
| 5,250,375 A | 10/1993 | Sebald et al. ............... | 430/8 |
| 5,886,119 A | 3/1999 | Schaedeli et al. ........... | 526/266 |
| 6,028,154 A | 2/2000 | Schaedeli et al. ........... | 526/266 |
| 6,042,989 A | 3/2000 | Schaedeli et al. ......... | 430/270.1 |
| 6,063,543 A | 5/2000 | Hien et al. ............... | 430/270.1 |
| 6,146,793 A | * 11/2000 | Schaedeli et al. ............. | 430/18 |
| 6,165,682 A | 12/2000 | Foster et al. ............. | 430/270.1 |
| 6,589,705 B1 | * 7/2003 | Sato et al. ............... | 430/270.1 |

FOREIGN PATENT DOCUMENTS

| | | |
|---|---|---|
| EP | 0 395 917 B1 | 11/1990 |
| EP | 0 492 253 A1 | 7/1992 |
| EP | 0 758 102 A1 | 2/1997 |
| EP | 0 955 562 A1 | 11/1999 |
| EP | 0 957 399 A2 | 11/1999 |
| EP | 1 096 319 A1 | 5/2001 |

* cited by examiner

*Primary Examiner*—Sin J. Lee
(74) *Attorney, Agent, or Firm*—Laurence A. Greenberg; Werner H. Stemer; Ralph E. Locher

(57) ABSTRACT

A chemically amplified photo-resist includes a polymer containing acid-labile radicals attached to a polar group and also contains anchor groups that allow attachment of a consolidating agent. The polymer includes first repeating units containing siloxane groups. The photoresist on the one hand exhibits an enhanced transparency for short-wavelength radiation and on the other hand permits chemical consolidation of the structured resist. A process for producing structured resists is a also described.

9 Claims, No Drawings

SILICON RESIST FOR PHOTOLITHOGRAPHY AT SHORT EXPOSURE WAVELENGTHS AND PROCESS FOR MAKING PHOTORESISTS

BACKGROUND OF THE INVENTION

Field of the Invention

The invention relates to a chemically amplified photoresist and to a process for producing structured resists consolidated in their dry etch resistance. The invention also is related to processes for making photoresists.

Photoresists are employed diversely in numerous lithographic techniques of microelectronics. Following their structuring (or patterning), they serve, for instance, as a mask in plasma etching operations for the structuring of underlying materials. In the litho-graphic process, exposure triggers a photoreaction that changes the chemical structure of the resist. In order to be able to operate even at low exposure doses, some prior-art resists operate in accordance with the principle of chemical amplification. In the case of the positive-working chemically amplified resists, for example, exposure liberates a strong acid that, in a subsequent heating step, produces a catalytic transformation or cleavage of the resist. The strong acid eliminates acid-labile groups of the polymer, liberating polar groups. Groups that can be cleaved by strong acids include, for instance, carboxylic acid tert-butyl esters. Following acid cleavage, carboxylic acid tert-butyl esters are in the form of free carboxylic acid groups. The conversion from a strongly apolar to a polar group drastically changes the solubility of the exposed and chemically modified resist in an appropriate development medium, such as an aqueous basic developer, for instance. Following development, the substrate beneath the photoresist, in the case of positive-working resists, is bare in the exposed areas, while in the unexposed areas it is still covered by photoresist. A structured photoresist is obtained whose structures can be transferred into the substrate beneath the photoresist in a dry etch operation. These structured resists are used as masks. In comparison with the underlying substrate, however, the overlying structured photoresist needs a comparatively high etch resistance in the plasma. Where that etch resistance is not already present, it is possible to reinforce the dry etch resistance of the structured resist by using a subsequent chemical treatment. Because the etch resistance of organosilicon compounds in an oxygen plasma is very different than organic hydrocarbon compounds, it is sensible, for instance, to incorporate organosilicon compounds subsequently into the structured resist if the substrate beneath it is composed of organic hydrocarbon compounds. The reaction of incorporation is often referred to as "silylation". Furthermore, the incorporation reaction also allows subsequent modification to the structure of the resist, such as a reduction in the size of trenches and holes. As a result, the resolution can be enhanced, so making it possible to reproduce structures whose critical feature size lies below the resolution limit imposed by the wavelength of the radiation that is used for the exposure. A consolidation process of this kind is described, for example, in commonly-owned European Patent No. EP 0 395 917 B1, which is equivalent to U.S. Pat. Nos. 5,234,794 and 5,234,793.

In order to ensure sufficient dry etch resistance of the resist, the layer thicknesses used with common one-layer resists, suitable, for example, for exposure with light having a wavelength of 248 nm, are 0.4–1 μm. Additionally, a variety of silicon photoresists is known for a two-layer technique, these resists featuring a high etch resistance in an oxygen plasma. The silicon is incorporated into the main chain of the resist polymers, as in the case of silsesquioxanes, for instance, or into the side chain, in the case of silicon-containing methacrylates, such as are described in EP 0 758 102, which corresponds to U.S. Pat. Nos. 6,042,989, 6,028,154, and 5,886,119. One specific variant of silicon resists based on methacrylate is represented by what is known as the CARL resist (CARL= Chemical Amplification of Resist Lines), which is described, for example, in the abovementioned EP 0 395 917 B1. This photoresist is suitable for relatively large exposure wavelengths of, for example, 248 nm or else 193 nm. At shorter wavelengths, however, it exhibits high absorption. Besides trimethylallylsilane and methacrylates, the polymer present in the photoresist includes a high fraction of maleic anhydride as comonomer. Together with free carboxylic acid groups, the anhydride acts as an anchor group for a silylating agent following the structuring of the resist. The silylating agent possesses a linking group, an amino group for example, which is able to react with the carboxylic anhydride function of the repeating units derived from maleic anhydride, and in so doing forms an amide or imide. Through the chemical incorporation of the silylating agent into the polymer it is possible to bring about a subsequent increase in the etch resistance of the photo-resist in an oxygen-containing plasma and to widen the lines of the structured resist.

A key problem of resists intended for use with an exposure wavelength of 157 nm or 13 nm is the transparency and the structurability of the polymer. In order to initiate an adequate photoreaction in the deep-lying regions of the photoresist even with shortwave radiation, the art is limited, with the resists presently available commercially, to thin resist layers with a thickness of up to 50 nm. Consequently, difficulties arise in the structuring of the material beneath the photoresist in the subsequent dry etch operation, since it is not possible to etch into the underlying substrate to sufficient depth.

SUMMARY OF THE INVENTION

It is accordingly an object of the invention to provide a silicon resist for photolithography at short exposure wavelengths and a process for making photoresists that overcome the hereinafore-mentioned disadvantages of the heretofore-known devices of this general type and that feature enhanced transparency for short-wavelength light, particularly radiation with a wavelength of 13 nm, and which can subsequently be modified in its properties.

With the foregoing and other objects in view, there is provided, in accordance with the invention, a chemically amplified photo-resist. The photo-resist includes a polymer, a photoacid generator, and a solvent. The polymer has acid-labile radicals that are attached to a polar group, so that following elimination of the acid-labile radicals the solubility of the polymer in polar developers is increased. The polymer also has anchor groups to which a linking group of a consolidating agent can be attached. The polymer includes first repeating units having a structure of Formula I.

FORMULA I

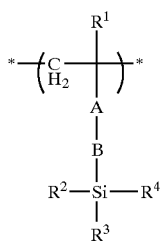

In Formula I, A is a single bond, —O—, —C(O)—O—. B is —$(CR^5R^6)_n$—, —$(O—(CR^5R^6))_n$—, a cyclo-alkylene group having from 5 to 20 carbon atoms, or an arylene group having from 6 to 22 carbon atoms. $R^1$ is —H, an alkyl group having from 1 to 10 carbon atoms, —CN or —$CF_3$. $R^2$, $R^3$, and $R^4$ are each an alkyl group having from 1 to 10 carbon atoms, a cycloalkyl group having from 5 to 20 carbon atoms or an aryl group having from 6 to 22 carbon atoms, it being possible as well for these groups to carry an acid-eliminable group attached by way of an ether or ester linkage or by way of an acetal, or are a siloxane group. $R^5$ and $R^6$ are —H or an alkyl group having from 1 to 10 carbon atoms. n is an integer from 0 to 6. If A is a single bond, B is a —$CH_2$— group and $R^1$ is —H, $R^2$, $R^3$, and $R^4$ may not simultaneously be a $CH_3$ group. In addition, A and B are chosen so that no Si—O—C group is formed.

The introduction of repeating units containing silicon enhances the transparency of the photoresist for short-wavelength radiation, particularly radiation with a wavelength of 157 nm or 13 nm. This makes it possible to use thicker photoresist layers without having to worry about difficulties in the structuring of the substrate beneath the photoresist during plasma etching, such as difficulties due to the development of resist feet. The use of an exposing radiation of short wavelength, especially 157 nm or 13 nm, makes it possible to resolve finer structures than is possible with the 243 nm or 193 nm wavelengths used at present. In the polymer of the photoresist of the invention, the silicon groups are disposed in the side chains. During the exposure of the photoresist, therefore, it is possible for an outgassing of low-molecular-mass silicon compounds to occur, these compounds depositing on the optics of the exposure devices and contaminating them irreversibly. It is therefore preferred to carry out exposure of the photoresist of the invention using light with a wavelength of 248 nm, since at such a wavelength the radiant energy is insufficient to eliminate low molecular mass silicon compounds from the polymer, or with radiation having a wavelength of 13 nm, since in that case a vacuum technique is employed and any low molecular mass silicon compounds which form will be rapidly removed so that they cannot deposit on the optics. In principle, the photoresist is suitable for other wavelengths as well, e.g., 157 nm; here, however, appropriate precautionary measures should be taken to prevent soiling of the optics. Where the layer thickness of the photoresist permits, subsequent widening of the structures in the lateral direction is also possible, by using, for example, the process of chemical consolidation described in the abovementioned EP 0 395 917 B1. As a result, it is possible to reduce still further the resolution of the structures produced. Because of the high proportion of silicon groups, the photoresist of the invention already possesses a high etch resistance to an oxygen plasma. This resistance can be intensified still further through the incorporation of additional silicon groups. For subsequent modification of the polymer, it has anchor groups that are able to enter into reaction with a linking group of a consolidating agent. Examples of such anchor groups include carboxyl groups, acid anhydride groups, glycidyl ethers, epoxides, imides, urethanes or ketene groups. The polymer present in the chemically amplified photo-resist of the invention further includes acid-labile radicals attached to polar groups. Examples of suitable acid-labile radicals include tert-alkyl ester, tert-butoxycarbonyloxy, tetrahydrofuranyl, tetrahydro-pyranyl, tert-butyl ether, lactone, or acetal groups. Tert-butyl ester groups and tert-butyl ether groups are particularly preferred. These acid-labile radicals are attached to polar groups, carboxyl or hydroxyl groups for example. Particularly suitable hydroxyl groups are acidic phenolic hydroxyl groups. Following the elimination of the acid-labile groups, these polar carboxyl or hydroxyl groups are liberated and so increase the polarity of the polymer and hence its solubility in polar alkaline developers. After the acid-labile groups have been eliminated, these polar groups can also be used as anchor groups for the attachment of a consolidating agent.

The radicals $R^1$ to $R^6$ may denote an alkyl group, which may be linear or branched—for example, —$(CH_2)_mCH_3$, where m is an integer between 0 and 9. Preferably, at least one of the radicals $R^2$, $R^3$, and $R^4$ is a siloxane group. The siloxane group may in turn carry substituents that are preferably formed from hydrocarbon radicals. Suitable examples include an alkyl group having from 1 to 10 carbon atoms, a cycloalkyl group having from 5 to 20 carbon atoms and an aryl group having from 6 to 22 carbon atoms, it also being possible for these groups to carry an acid-eliminable group which is attached by way of an ether or ester linkage or by way of an acetal.

The film-forming polymer may be obtained by polymerization or copolymerization of corresponding monomers that include an anchor group and/or a polar group protected by an acid-labile radical. The polymer is prepared by free-radical polymerization. Accordingly, the polymerization may be conducted in solution, in bulk or in suspension. The free-radical polymerization may be initiated by light or by adding suitable free-radical initiators.

Photoacid generators that can be used are the photo-acid generators customary for chemically amplified photoresists. Preference is given to using onium compounds, as described, for example, in commonly-owned European Patent Application No. EP 0 955 562 A1.

The following are possible solvents for the chemically amplified photoresist: methoxypropyl acetate, cyclopentanone, cyclohexanone, γ-butyrolactone, ethyl lactate, diethylene glycol dimethyl ether, ethylene glycol dimethyl ether, or a mixture of at least two of these compounds. In general, however, any common solvents or mixtures thereof can be used if they are able to take up the components of the photoresist in a clear, homogeneous, and storage-stable solution and ensure a good coat quality when the substrate is coated.

The components described above are used in the resist preferably in the following proportions:

film-forming polymer: from 1 to 50% by weight, prefer-ably from 2 to 10% by weight, photoacid generator: from 0.01 to 10% by weight, preferably from 0.01 to 0.1% by weight, and solvent: from 80 to 99% by weight, preferably from 88 to 97% by weight.

In order to obtain a high etch resistance in an oxygen plasma, the aim is for a high fraction of silicon groups in the polymer. In the first repeating units of the formula I, therefore, preferably at least one of the radicals $R^2$, $R^3$, and $R^4$ is a siloxane group. Where other radicals are used for $R^2$, $R^3$, and $R^4$ in addition to the siloxane groups, they are with particular preference aryl, alkyl or cycloalkyl groups. In this case, the polymer has a low absorption for short-wavelength light.

The siloxane group preferably features a structure of the Formula II

FORMULA II

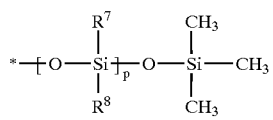

in which $R^7$ and $R^8$ are —CH$_3$ or

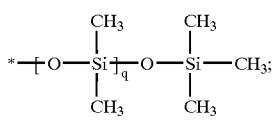

p is an integer from 0 to 10; and
q is an integer from 0 to 5.

The first repeating units of the Formula I can be introduced into the polymer by copolymerizing corresponding silicon comonomers. Examples of suitable comonomers are vinylsilanes or vinylsiloxanes of the general Formula III

FORMULA III

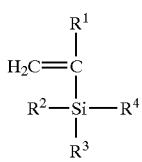

where $R^1$, $R^2$, $R^3$, and $R^4$ are as defined above.

Also suitable are allylsilanes or allylsiloxanes generally of Formula IV

FORMULA IV

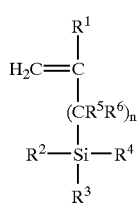

where $R^1$, $R^2$, $R^3$, $R^4$, $R^5$, $R^6$, and n are as defined above. With particular preference, n=1, 2 or 3 and $R^5$=$R^6$=H.

It is also possible to use vinyl alcohol-derived ethers generally of Formula V

FORMULA V

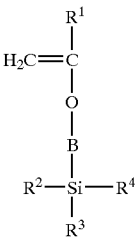

where B, $R^1$, $R^2$, $R^3$, and $R^4$ are as defined above.

It is also possible, furthermore, to use esters generally of Formula VI as comonomers.

FORMULA VI

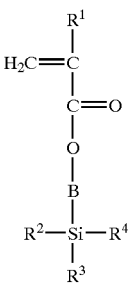

where B, $R^1$, $R^2$, $R^3$, and $R^4$ are as defined above.

With the objects of the invention in view, there is also provided a process for producing structured resists which includes the following steps. The first step is applying a photoresist. The next step is removing the solvent to give a photosensitive resist film. The next step is sectionally exposing sections of the resist film to liberate an acid from the photoacid generator in the exposed sections of the resist film. The next step is contrasting the exposed resist film by eliminating the acid-labile groups of the polymer with the acid in the exposed sections of the resist film. The next step is developing the exposed and contrasted resist film in a developer to remove the exposed sections of the resist film to give a structured resist. The next step is applying a consolidating agent to give a consolidated structured resist. The next step is removing excess amplifying agent.

Other features that are considered as characteristic for the invention are set forth in the appended claims.

Although the invention is described herein as embodied in a silicon resist for photolithography at short exposure wavelengths and a process for making photoresists, it is nevertheless not intended to be limited to the details given, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the following examples.

DESCRIPTION OF THE PREFERRED EMBODIMENTS

Referring now to the invention in detail, it is noted that the photoresist polymer preferably includes carboxylic anhydride groups as anchor groups. In one preferred embodiment, therefore, the polymer includes second repeating units that contain a carboxylic anhydride group. These second repeating units can be introduced into the polymer by copolymerizing unsaturated carboxylic anhydrides. With particular preference, the second repeating unit is derived from an unsaturated carboxylic acid selected from the group including maleic anhydride, itaconic anhydride, cyclohexene-dicarboxylic anhydride, norbornenedicarboxylic anhydride, and meth-acrylic anhydride. Maleic anhydride is particularly preferred.

It is further preferred for the anchor group of the polymer to be formed by a carboxyl group. In one preferred embodiment, therefore, the polymer includes third repeating units that contain carboxyl groups. The carboxyl groups are preferably esterified with an acid-labile group. For this purpose, it is possible, for example, to use the abovementioned acid-labile groups. Tert-butyl esters are particularly preferred. Free carboxyl groups provided in the polymer make it possible to enhance the adhesion of the photoresist to the substrate.

With particular preference, the third repeating unit is derived from an unsaturated carboxylic acid selected from the group including acrylic acid, methacrylic acid, cyclohexenecarboxylic acid, norbornenecarboxylic acid, maleic acid, itaconic acid, cyclohexene-dicarboxylic acid, norbornenedicarboxylic acid, and the acidic mono-esters of the dicarboxylic acids. The monoesters may be formed with any desired alcohols. Methanol and ethanol are preferred examples.

The fraction of the first repeating units in the polymer is preferably chosen within the range from 10 to 30 mol %. The fraction of the second repeating units is preferably from 30 to 50 mol %, that of the third repeating units preferably from 15 to 30 mol %. Where the polymer includes third repeating units containing free carboxyl groups, these are preferably present in a fraction of from 4 to 10 mol %.

Besides the components stated, other components may be added to the chemically amplified photoresist of the invention. The other components advantageously influence the resist system in respect of resolution, film-forming properties, storage stability, radiation sensitivity, service life effect, etc.

As already remarked above, the chemically amplified photoresist of the invention features enhanced transparency for low-wavelength radiation and features the possibility for subsequent modification of the properties of the structured resist. The invention accordingly further provides a process for producing structured resists which includes the following steps:

(a) applying the above-described photoresist to a substrate;
(b) removing the solvent to give a photosensitive resist film;
(c) sectionally exposing the resist film, an acid being liberated from the photoacid generator in the exposed sections of the resist film;
(d) contrasting the exposed resist film, the acid-labile groups of the polymer being eliminated by the acid in the exposed sections of the resist film;
(e) developing the exposed and contrasted resist film in a developer, the exposed sections of the resist film being removed to give a structured resist;
(f) if desired, liberating the anchor groups;
(g) applying a consolidating agent, to give a structured resist consolidated in its dry etch resistance; and
(h) removing excess consolidating agent.

The photoresist of the invention is first applied by conventional methods to the substrate: for example, by spin coating, spraying or dipping techniques. The substrate used may be, for example, a silicon wafer, that may also have already been structured or in which electronic components may have already been integrated. It is also possible for a bottom resist to have already been applied to the silicon wafer. Subsequently, the solvent is removed by conventional techniques. Generally for this purpose the substrate with the photoresist is heated, so giving a photosensitive resist film.

The resist film is subsequently exposed, for which purpose it is likewise possible to employ the conventional techniques. Exposure may take place, for example, through a photomask or else by direct exposure by using interference lithography with focused electrons or ions. The exposing radiation preferably has a wavelength in the range from 10 to 400 nm or a wavelength less than 200 nm, with particular preference from 10 to 200 nm, in particular from 10 to 160 nm, especially 13 nm. In the exposed areas, a strong acid is liberated from the photoacid generator, and a latent image of the desired structure is formed. Exposure of the resist film is followed by a contrasting step in which the latent image is enhanced and is impressed into the polymer of the photoresist, so that the photoresist now has a chemical profile. For this purpose, the substrate with the exposed resist film is heated, generally at temperatures from 80 to 200° C. Under the catalytic influence of the acid, acid-labile groups, for example, on the polymer are eliminated and polar groups are liberated. This raises the polarity of the polymer and hence also its solubility in polar alkaline developer solutions. In the developing step, the exposed sections of the resist film are removed by detaching them, for example, using an aqueous solution of tetramethylammonium hydroxide. A structured resist is obtained in which the unexposed areas remain as lines or raised structures on the substrate. The structure of the developed photoresist can then be transferred into the substrate beneath it by using, for example, plasma etching. Where the etch resistance of the structured resist is to be increased further or the structures of the structured resist are to be widened, an amplifying step takes place in which the structured photoresist is chemically consolidated in terms of its dry etch resistance. For this purpose, corresponding anchor groups must be available on the photoresist polymer. Where the photoresist contains carboxylic anhydride groups, for example, the consolidating agent can be applied to the structured photoresist immediately after structuring. In another embodiment of the process of the invention, the polar groups of the photoresist, protected by acid-labile groups, are utilized as anchor groups. For this purpose, these groups must first of all be liberated in the unexposed sections of the photoresist that have remained on the substrate. This can be done, for example, by subjecting the structured resist to flood exposure followed by heat treatment. An alternative option is to provide in the photoresist a thermoacid generator, a benzylthiolanium compound for example, and to heat the structured resist to a temperature at which the acid is liberated from the thermoacid generator.

For consolidation the consolidating agent is applied to the structured photoresist. As amplifying agents it is possible, for example, to use agents as described in EP 0 395 917 B1. Particular preference is given here to bifunctional amplifying agents, because these lead to further crosslinking of the structured photoresist. With particular preference, the consolidating agent is applied in solution to the structured photoresist. After the end of the consolidating reaction, excess consolidating agent is removed.

The invention is illustrated with reference to an example.

For the structurable polymer, a mixture of the monomers maleic anhydride (50 mol %), tert-butyl methacrylate (30 mol %), allyltris(trimethylsiloxy)silane, and tris-(trimethylsiloxy)silylpropyl methacrylate (10 mol % of each) are subjected to free-radical polymerization in a metering batch in butanone, using α,α-azobisisobutyronitrile (AIBN) as initiator. First of all the maleic anhydride, the allyltris(trimethylsiloxy)silane, the tris(trimethylsiloxy) silylpropyl methacrylate, and 10% of the tert-butyl methacrylate are introduced in butanone solvent and the polymerization is started with 50% of the initiator. Over a period of one hour, the remaining 90% of the tert-butyl methacrylate and the other half of the AIBN initiator, in butanone, are metered into the reaction mixture. After polymerization has taken place (8 hours), some of the maleic anhydride is cleaved by methanol to give the acidic monoester. For purification, the polymer is precipitated first from isopropanol/water and then from heptane. Prepared from the dried polymer is a photoresist including a 5% strength by weight solution of the polymer in methoxypropyl acetate, a photoacid generator, and a base for adjusting the sensitivity.

In order to demonstrate the structurability of the above-prepared resist polymer, the photoresist is spincoated on a wafer and sectionally exposed with the aid of a mask. After a baking step, developing is carried out in a customary manner using a basic developer. The result is a resist structured in accordance with the structure of the mask. The stick drawing of the polymer is depicted below as Formula VII. In the polymer, the repeating units a, b, c, d, and e are distributed statistically. The coefficients a, b, c, d, and e correspond to the percentage molar fractions of the comonomers, indicated above.

FORMULA VII

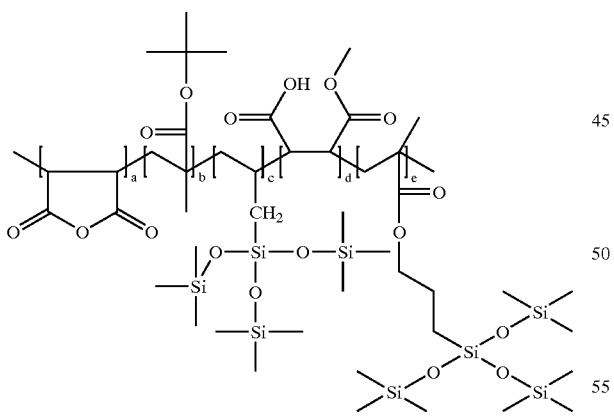

We claim:

1. A chemically amplified photo-resist, comprising:

a polymer having a polar group, acid-labile radicals attached to said polar group to be eliminated for increasing solubility of the polymer in polar developers, and anchor groups for attaching to a linking group of a consolidating agent, the polymer including first repeating units having a structure according to Formula I

FORMULA I

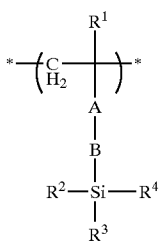

where

A is selected from the group consisting of a single bond, —O—, and —C(O)—O—;

B is selected from the group consisting of —$(CR^5R^6)_n$—, —$(O—(CR^5R^6))_n$—, a cyclo-alkylene group having from 5 to 20 carbon atoms, and an arylene group having from 6 to 22 carbon atoms;

$R^1$ is selected from the group consisting of —H, an alkyl group having from 1 to 10 carbon atoms, —CN, and —$CF_3$;

$R^2$, $R^3$, and $R^4$ are each selected from the group consisting of an alkyl group having from 1 to 10 carbon atoms, a cycloalkyl group having from 5 to 20 carbon atoms, an aryl group having from 6 to 22 carbon atoms, and a siloxane group;

$R^5$ and $R^6$ are selected from the group consisting of —H and an alkyl group having from 1 to 10 carbon atoms; and n is an integer from 0 to 6; and if A is a single bond, then B is a —$CH_2$— group, $R^1$ is —H, $R^2$, $R^3$, and $R^4$ may not simultaneously be a $CH_3$ group, and A and B are chosen so that no Si—O—C group is formed;

second repeating units derived from unsaturated carboxylic acid anhydrides selected from the group consisting of maleic anhydride, itaconic anhydride, cyclohexenedicarboxylic anhydride, norbornenedicarboxylic anhydride, and methacrylic anhydride;

third repeating units derived from the acidic methyl or ethyl monoesters of an unsaturated dicarboxylic acid selected from the group consisting of maleic acid, itaconic acid, cyclohexenedicarboxylic acid and norbornenedicarboxylic acid;

and fourth repeating units derived from an unsaturated carboxylic acid selected from the group consisting of acrylic acid, methacrylic acid, cyclohexenecarboxylic acid, and norbornenecarboxylic acid, wherein said carboxyl groups of said fourth repeating units are esterified with an acid-labile radical;

a photoacid generator; and a solvent.

2. The chemically amplified photoresist according to claim 1, wherein at least one of $R^2$, $R^3$, and $R^4$ is an alkyl group having from 1 to 10 carbon atoms, a cycloalkyl group having from 5 to 20 carbon atoms or an aryl group having from 6 to 22 carbon atoms carrying an acid-eliminable group attached by an ether linkage.

3. The chemically amplified photoresist according to claim 1, wherein at least one of $R^2$, $R^3$, and $R^4$ is an alkyl group having from 1 to 10 carbon atoms, a cycloalkyl group having from 5 to 20 carbon atoms or an aryl group having from 6 to 22 carbon atoms carrying an acid-eliminable group attached by an ester linkage.

4. The chemically amplified photoresist according to claim 1, wherein at least one of $R^2$, $R^3$, and $R^4$ is an alkyl group having from 1 to 10 carbon atoms, a cycloalkyl group having from 5 to 20 carbon atoms or an aryl group having from 6 to 22 carbon atoms carrying an acid-eliminable group attached by an acetal.

5. The chemically amplified photoresist according to claim 1, wherein the siloxane group has a structure according to Formula II

FORMULA II

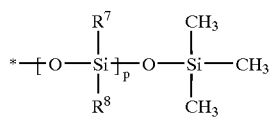

in which
$R^7$ and $R^8$ are selected from the group consisting of —$CH_3$ and

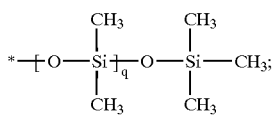

p is an integer from 0 to 10; and
q is an integer from 0 to 5.

6. A process for producing structured resists, which comprises the steps of:
(a) applying a photoresist to a substrate, the photoresist including:
a polymer having a polar group, acid-labile radicals attached to the polar group to be eliminated for increasing solubility of the polymer in polar developers, and anchor groups for attaching to a linking group of a consolidating agent, the polymer including first repeating units having a structure according to Formula I

FORMULA I

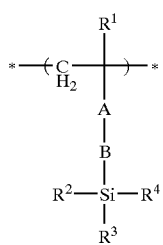

where
A is selected from the group consisting of a single bond, —O—, and —C(O)—O—;
B is selected from the group consisting of —($CR^5 R^6$)$_n$—, —(O—($CR^5R^6$))$_n$—, a cyclo-alkylene group having from 5 to 20 carbon atoms, and an arylene group having from 6 to 22 carbon atoms;

$R^1$ is selected from the group consisting of —H, an alkyl group having from 1 to 10 carbon atoms, —CN, and —$CF_3$;
$R^2$, $R^3$, and $R^4$ are each selected from the group consisting of an alkyl group having from 1 to 10 carbon atoms, a cycloalkyl group having from 5 to 20 carbon atoms, an aryl group having from 6 to 22 carbon atoms, and a siloxane group;
$R^5$ and $R^6$ are selected from the group consisting of —H and an alkyl group having from 1 to 10 carbon atoms; and
n is an integer from 0 to 6; and
if A is a single bond, B is a —$CH_2$— group and $R^1$ is —H, $R^2$, $R^3$, and $R^4$ may not simultaneously be a $CH_3$ group, and, A and B are chosen so that no Si—O—C group is formed,
second repeating units derived from unsaturated carboxylic acid anhydrides selected from the group consisting of maleic anhydride, itaconic anhydride, cyclohexenedicarboxylic anhydride, norbornenedicarboxylic anhydride, and methacrylic anhydride;
third repeating units derived from the acidic methyl or ethyl monoesters of an unsaturated dicarboxylic acid selected from the group consisting of maleic acid, itaconic acid, cyclohexenedicarboxylic acid, and norbornenedicarboxylic acid;
and fourth repeating units derived from an unsaturated carboxylic acid selected from the group consisting of crylic acid, methacrylic acid, cyclohexenecarboxylic acid, and norbornenecarboxylic acid, wherein said carboxyl groups of said fourth repeating units are esterified with an acid-labile radical;
a photoacid generator, and
a solvent;

(b) removing the solvent to give a photosensitive resist film;
(c) sectionally exposing sections of the resist film to liberate an acid from the photoacid generator in the exposed sections of the resist film;
(d) contrasting the exposed resist film by eliminating the acid-labile groups of the polymer with the acid in the exposed sections of the resist film;
(e) developing the exposed and contrasted resist film in a developer to remove the exposed sections of the resist film to give a structured resist;
(f) applying a consolidating agent to give a consolidated structured resist; and
(g) removing excess consolidating agent.

7. The process according to claim 6, which further comprises the step of liberating the anchor groups after the developing step.

8. The process of claim 6, wherein the exposing step (c) includes exposing with radiation having a wavelength less than 200 nm.

9. The process of claim 8, wherein the consolidating agent in the applying step (f) is applied in solution.

* * * * *